United States Patent
Liang et al.

(10) Patent No.: US 11,732,157 B2
(45) Date of Patent: Aug. 22, 2023

(54) POLISHING COMPOSITIONS AND METHODS OF USE THEREOF

(71) Applicant: Fujifilm Electronic Materials U.S.A., Inc., N. Kingstown, RI (US)

(72) Inventors: Yannan Liang, Gilbert, AZ (US); Bin Hu, Chandler, AZ (US); Liqing Wen, Mesa, AZ (US); Shu-Wei Chang, Taoyuan (TW)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

(21) Appl. No.: 17/063,965

(22) Filed: Oct. 6, 2020

(65) Prior Publication Data

US 2021/0108106 A1    Apr. 15, 2021

Related U.S. Application Data

(60) Provisional application No. 62/915,290, filed on Oct. 15, 2019.

(51) Int. Cl.
| | |
|---|---|
| *C09G 1/02* | (2006.01) |
| *H01L 21/321* | (2006.01) |
| *B24B 1/00* | (2006.01) |
| *C09K 3/14* | (2006.01) |
| *C09G 1/00* | (2006.01) |
| *C09K 13/06* | (2006.01) |
| *C09G 1/04* | (2006.01) |
| *C09G 1/06* | (2006.01) |
| *B24B 37/04* | (2012.01) |
| *H01L 21/306* | (2006.01) |

(52) U.S. Cl.
CPC .......... *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09K 3/1454* (2013.01); *C09K 3/1463* (2013.01); *C09K 13/06* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 2004/0106531 A1 | 6/2004 | Kanno et al. | |
| 2008/0206995 A1* | 8/2008 | Tomiga | H01L 21/3212 438/693 |
| 2009/0209104 A1* | 8/2009 | Kimura | C09K 3/1463 438/693 |
| 2016/0108284 A1* | 4/2016 | Yoshizaki | C09G 1/00 252/79.1 |
| 2016/0189976 A1 | 6/2016 | Wang et al. | |
| 2017/0088748 A1* | 3/2017 | Stender | C09G 1/04 |
| 2017/0210946 A1 | 7/2017 | Lam et al. | |
| 2017/0260421 A1 | 9/2017 | Kraft et al. | |
| 2018/0244956 A1* | 8/2018 | Hains | H01L 21/31053 |
| 2018/0251658 A1 | 9/2018 | Wang et al. | |
| 2018/0282580 A1 | 10/2018 | Leonov et al. | |
| 2018/0340094 A1 | 11/2018 | Liang et al. | |
| 2018/0371292 A1 | 12/2018 | Wang | |
| 2019/0062598 A1 | 2/2019 | Stender et al. | |

FOREIGN PATENT DOCUMENTS

| | | | |
|---|---|---|---|
| CN | 1660923 A | 8/2005 | |
| CN | 101665661 A | 3/2010 | |
| CN | 105295737 A | 2/2016 | |
| CN | 105400434 A | 3/2016 | |
| CN | 107429120 A | 12/2017 | |
| CN | 108603076 A | 9/2018 | |
| EP | 2977418 | 1/2016 | |
| EP | 3257910 | * 12/2017 | ............... C09G 1/02 |
| EP | 3263667 | * 3/2018 | ............... C09G 1/00 |
| WO | WO 2016/065060 | 4/2016 | |

OTHER PUBLICATIONS

K. Cheemalapati et al, "Key Chemical Componenets in Metal CMP Slurries", in Microelectroni Applications of Chemical Mechanical Planarization, edited in Yuzhuo Li, published by John Wiley & Sons, section 7.4.2. (Year: 2008).*
R.S. Cooper et al., "Anionic Phosphate Surfactants", The Journal of the American Oil Chemists' Society, vol. 40, pp. 642-645. (Year: 1963).*
P. Arora et al., "Synthesis, Properties and Applications of Anionic Phosphate Ester Surfactants: A Review", Tenside Surf. Det. vol. 55 (2018) 4, pp. 266-272. (Year: 2018).*
International Search Report and Written Opinion of the International Searching Authority for International Application No. PCT/US2020/054371 dated Jan. 11, 2021.
Extended European Search Report in European Appln No. 20875901.9, dated Nov. 10, 2022, 5 pages.
Office Action in Chinese Appln. No. 202080004088.8, dated May 26, 2023, 19 pages (with English translation).
SG Office Action in Singaporean Appln. No. 11202203460U, dated Jun. 7, 2023, 10 pages.

* cited by examiner

Primary Examiner — Jiong-Ping Lu
(74) Attorney, Agent, or Firm — Fish & Richardson P.C.

(57) ABSTRACT

A polishing composition includes an abrasive; an optional pH adjuster; a barrier film removal rate enhancer; a TEOS removal rate inhibitor; a cobalt removal rate enhancer; an azole-containing corrosion inhibitor; and a cobalt corrosion inhibitor.

46 Claims, No Drawings

POLISHING COMPOSITIONS AND METHODS OF USE THEREOF

CROSS-REFERENCE TO RELATED APPLICATION

The present application claims priority to U.S. Provisional Application Ser. No. 62/915,290, filed on Oct. 15, 2019, the contents of which are hereby incorporated by reference in their entirety.

BACKGROUND

The semiconductor industry is continually driven to improve chip performance by further miniaturization of devices by process, materials, and integration innovations. Earlier materials innovations included the introduction of copper, replacing aluminum as the conductive material in the interconnect structure, and the use of tantalum (Ta)/tantalum nitride (TaN) (or titanium (Ti)/titanium nitride (TiN)) as diffusion barrier to separate the Cu conductive material from the non-conductive/insulator dielectric material. Copper (Cu) was chosen as the interconnect material because of its low resistivity and superior resistance against electro-migration.

However, as the features of newer generation chips shrink, the multilayer Cu/barrier/dielectric stacks have to be thinner and more conformal to maintain effective interconnect resistivity in Back End of Line (BEOL). The thinner Cu and the Ta/TaN barrier film schemes present problems with resistivity and flexibility in deposition. For example, with smaller dimensions and advanced manufacturing nodes, resistivity is proceeding to be exponentially worse and improvements in transistor circuit speed (at Front End of Line (FEOL)) are being cut in half by the delay coming from the conductive Cu/Barrier wiring (BEOL). Cobalt (Co) has emerged as a leading candidate for use as a liner material, a barrier layer, as well as a conductive layer. Furthermore, cobalt is also being investigated as a replacement for tungsten (W) metal in multiple applications such as W metal contacts, plugs, vias, and gate materials.

Many currently available CMP slurries were specifically designed to remove materials more common in older chip designs, such as the aforementioned copper and tungsten. Certain components in these older CMP slurries may cause deleterious and unacceptable defects in cobalt, since cobalt is more susceptible to chemical corrosion. As a result, when using copper polishing slurries on cobalt layers, unacceptable corrosion, wafer topography, and removal rate selectivity often occur.

With the increasing use of cobalt (Co) as a metal component in semiconductor fabrication, there is a market need for CMP slurries that can effectively polish a dielectric component or a barrier component on Co-containing surfaces without significant Co corrosion.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

As defined herein, unless otherwise noted, all percentages expressed should be understood to be percentages by weight to the total weight of the chemical mechanical polishing composition.

In one aspect, embodiments disclosed herein relate to a polishing composition that includes an abrasive; an optional pH adjuster; a barrier film removal rate enhancer; a TEOS removal rate inhibitor; a cobalt removal rate enhancer; an azole-containing corrosion inhibitor; and a cobalt corrosion inhibitor, in which the barrier film removal rate enhancer is different from the cobalt removal rate enhancer.

In another aspect, embodiments disclosed herein relate to a polishing composition that includes an abrasive; an optional pH adjuster; an organic acid or a salt thereof; an amino acid; an alkanolamine or a cationic polymer; an azole-containing corrosion inhibitor; and an anionic surfactant, in which the organic acid is different from the amino acid.

In yet another aspect, embodiments disclosed herein relate to a method of polishing a substrate, including the steps of: applying the polishing composition described herein to a surface of a substrate, wherein the surface includes cobalt; and bringing a pad into contact with the surface of the substrate and moving the pad in relation to the substrate.

Other aspects and advantages of the claimed subject matter will be apparent from the following description and the appended claims.

DETAILED DESCRIPTION

Embodiments disclosed herein relate generally to compositions and methods of using said compositions to polish substrates that include at least a cobalt portion and can, more specifically, include at least cobalt and dielectric (TEOS, SiN, low-k, etc.) portions. The compositions disclosed herein can be alkaline in nature and non-selective cobalt buffing slurries (i.e., exhibiting a dielectric/cobalt polishing selectivity of ~1:1).

With the introduction of cobalt (Co) as a barrier layer, conductive layer, and/or W replacement, there is a market need for CMP slurries that can polish Co at effective material removal rates without experiencing significant Co corrosion (i.e., having a moderate Co removal rate) and have a range of selectivities in polishing rates of other metals and metal nitrides or oxides (Cu, Ti, TiN, Ta TaN, $Ta_2O_5$, $TiO_2$, Ru, $ZrO_2$, $HfO_2$, etc.), and dielectric films (SiN, silicon oxide, Poly-Si, low k dielectrics (e.g., carbon doped silicon oxides), etc.). For example, after an aggressive bulk polishing step where large amounts of materials are removed, it is often desirable to perform a buffing polish step in order to obtain the desired surface topography. In some embodiments, the composition used for the buffing polish will remove dielectric materials and metals (e.g., TEOS, SiN, and Co) at a lower rate than what occurs during a bulk polishing step or at approximately the same removal rate for each component (e.g., within 10% or within 5%) in order to obtain the desired surface topography. Because Co is more chemically reactive than Cu and other noble metals, Co corrosion prevention is very challenging in advanced nodes slurry design. Current metal polishing slurries are ill-equipped to polish surfaces that include Co as they suffer from Co corrosion issues during the CMP process. In addition, it is generally desirable to remove a certain amount of Co during polishing to form a smooth surface in a patterned semiconductor substrate for subsequent manufacturing processes.

In one or more embodiments, the polishing composition of the present disclosure includes an abrasive; a pH adjuster; a barrier film removal rate enhancer; a TEOS removal rate inhibitor; a cobalt removal rate enhancer; an azole-containing corrosion inhibitor; and a cobalt corrosion inhibitor.

In one or more embodiments, a polishing composition according to the present disclosure can include from about 0.1% to about 25% by weight of abrasive, 0% to about 10% by weight pH adjuster, about 0.01% to about 3% by weight barrier film removal rate enhancer, about 0.001% to about 15% by weight TEOS removal rate inhibitor, about 0.01% to about 5% by weight cobalt removal rate enhancer, about 0.001% to about 3% by weight azole-containing corrosion inhibitor, about 0.001% to about 1% by weight cobalt corrosion inhibitor, and the remaining percent (e.g., about 20-99% by weight) of solvent (e.g., deionized water).

In one or more embodiments, the present disclosure provides a concentrated polishing slurry that can be diluted with water prior to use by up to a factor of two, or up to a factor of three, or up to a factor of four, or up to a factor of six, or up to a factor of eight, or up to a factor of ten. In other embodiments, the present disclosure provides a point-of-use (POU) polishing slurry for use on cobalt substrates, comprising the above-described polishing slurry, water, and optionally an oxidizer.

In one or more embodiments, a POU polishing slurry can include from about 0.1% to about 12% by weight of abrasive, 0% to about 3% by weight pH adjuster, about 0.01% to about 1% by weight barrier film removal rate enhancer, about 0.001% to about 10% by weight TEOS removal rate inhibitor, about 0.01% to about 2% by weight cobalt removal rate enhancer, about 0.001% to about 0.5% by weight azole-containing corrosion inhibitor, about 0.001% to about 0.5% by weight cobalt corrosion inhibitor, optionally about 0.1 to about 5% by weight oxidizer, and about 75% to about 99% by weight of solvent (e.g., deionized water).

In one or more embodiments, a concentrated polishing slurry may include from about 1% to about 25% by weight of abrasive, 0% to about 10% by weight pH adjuster, about 0.1% to about 3% by weight barrier film removal rate enhancer, about 0.01% to about 15% by weight TEOS removal rate inhibitor, about 0.1% to about 5% by weight cobalt removal rate enhancer, about 0.01% to about 3% by weight azole-containing corrosion inhibitor, about 0.01% to about 1% by weight cobalt corrosion inhibitor, and the remaining weight (e.g., from about 20% to about 98.5% by weight) of solvent (e.g., deionized water).

In one or more embodiments, the polishing composition described herein can include at least one (e.g., two or three) abrasive. In some embodiments, the at least one abrasive is selected from the group consisting of cationic abrasives, substantially neutral abrasives, and anionic abrasives. In one or more embodiments, the at least one abrasive is selected from the group consisting of alumina, silica, titania, ceria, zirconia, co-formed products thereof (i.e., co-formed products of alumina, silica, titania, ceria, or zirconia), coated abrasives, surface modified abrasives, and mixtures thereof. In some embodiments, the at least one abrasive does not include ceria. In some embodiments, the at least one abrasive is high-purity, and can have less than about 100 ppm of alcohol, less than about 100 ppm of ammonia, and less than about 100 parts per billion (ppb) of an alkali cation such as sodium cation. The abrasive can be present in an amount of from about 0.1% to about 12% (e.g., from about 0.5% to about 10%), based on the total weight of the POU polishing composition, or any subranges thereof.

In one or more embodiments, the at least one abrasive is in an amount of from at least about 0.1% (e.g., at least about 0.5%, at least about 1%, at least about 2%, at least about 4%, at least about 5%, at least about 10%, at least about 12%, at least about 15%, or at least about 20%) by weight to at most about 25% (e.g., at most about 20%, at most about 18, at most about 15%, at most about 12%, at most about 10%, or at most about 5%) by weight of the polishing composition described herein.

In one or more embodiments, the polishing composition described herein can include at least one (e.g., two or three) optional pH adjuster. In some embodiments, the at least one pH adjuster is selected from the group consisting of ammonium hydroxide, sodium hydroxide, potassium hydroxide, cesium hydroxide, monoethanolamine, diethanolamine, triethanolamine, methylethanolamine, methyldiethanolamine tetrabutylammonium hydroxide, tetrapropylammonium hydroxide, tetraethyl ammonium hydroxide, tetramethylammonium hydroxide, ethyltrimethyl ammonium hydroxide, diethyldimethylammonium hydroxide, dimethyldipropyl ammonium hydroxide, benzyltrimethyl ammonium hydroxide, tris(2-hydroxyethyl)methylammonium hydroxide, choline hydroxide, and any combinations thereof.

In one or more embodiments, the at least one pH adjuster, when included in the composition, is in an amount of from at least about 0.01% (e.g., at least about 0.05%, at least about 0.1%, at least about 0.5%, at least about 1%, at least about 2%, at least about 4%, at least about 5%, or at least about 8%) by weight to at most about 10% (e.g., at most about 9%, at most about 8%, at most about 7%, at most about 6%, at most about 5%, at most about 4%, at most about 3%, at most about 2%, at most about 1%, at most about 0.5%, at most about 0.2%, or at most about 0.1%) by weight of the polishing composition described herein.

In one or more embodiments, the pH value of the polishing composition can range from at least about 7 (e.g., at least about 7.5, at least about 8, at least about 8.5, at least about 9, at least about 9.5, at least about 10, at least about 10.5, at least about 11, at least about 11.5, or at least about 12) to at most about 14 (e.g., at most about 13.5, at most about 13, at most about 12.5, at most about 12, at most about 11.5, at most about 11, at least about 10.5, at most about 10, at most about 9.5, or at most about 9). Without wishing to be bound by theory, it is believed that a polishing composition having a pH lower than 7 would significantly increase cobalt removal rate and corrosion, and a polishing composition having a pH higher than 14 can affect the stability of the suspended abrasive and would significantly increase the roughness and decrease the overall quality of a film polished by such a composition. In order to obtain the desired pH, the relative concentrations of the ingredients in the polishing compositions described herein can be adjusted.

In one or more embodiments, the polishing composition described herein can include at least one (e.g., two or three) barrier film removal rate enhancer. In some embodiments, the at least one barrier film removal rate enhancer is an organic acid (such as a carboxylic acid, an amino acid, a sulfonic acid, or a phosphonic acid) or a salt thereof. In some embodiments, the barrier film removal rate enhancer can be a carboxylic acid that includes one or more (e.g., two, three, or four) carboxylic acid groups, such as a dicarboxylic acid or a tricarboxylic acid. In some embodiments, the barrier film removal rate enhancer can be an organic acid or a salt thereof selected from the group consisting of gluconic acid, lactic acid, citric acid, tartaric acid, malic acid, glycolic acid, malonic acid, formic acid, oxalic acid, acetic acid, propionic acid, peracetic acid, succinic acid, amino acetic acid, phenoxyacetic acid, bicine, diglycolic acid, glyceric acid, tricine, alanine, histidine, valine, phenylalanine, proline, glutamine, aspartic acid, glutamic acid, arginine, lysine, tyrosine, benzoic acid, 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic acid, p-toluenesulfonic acid, trifluoromethane-sulfonic acid, ethyl phosphoric acid, cyanoethyl phosphoric acid, phenyl phosphoric acid, vinyl phosphoric acid, poly(vinylphosphonic acid), 1-hydroxyethane-1,1-diphosphonic acid, nitrilotri(methylphosphonic acid), diethylenetriaminepentakis (methylphosphonic acid), N,N,N'N'-ethylenediaminetetrakis(methylene phosphonic acid), n-hexylphosphonic acid, benzylphosphonic acid, phenylphosphonic acid, and salts and mixtures thereof. Without wishing to be bound by theory, it is surprising that an organic acid or a salt thereof (such as those described above) can be used as an effective barrier removal rate enhancer in the polishing composition described herein to improve the removal rate of a barrier film (e.g., a Ta or TaN film) in a semiconductor substrate.

In one or more embodiments, the barrier film rate removal rate enhancer is in an amount of from at least about 0.01% (e.g., at least about 0.02%, at least about 0.05%, at least about 0.1%, at least about 0.2%, at least about 0.4%, at least about 0.5%, at least about 0.6%, at least about 0.8%, at least about 1%, or at least about 1.5%) by weight to at most about 3% (e.g., at most about 2.5%, at most about 2%, at most about 1.5%, at most about 1%, at most about 0.8%, or at most about 0.5%) by weight of the polishing composition described herein.

In one or more embodiments, the polishing composition described herein can include at least one (e.g., two or three) TEOS removal rate inhibitor. In some embodiments, the at least one TEOS removal rate inhibitor is an amine containing compound (such as a compound selected from alkanolamines and cationic polymers). In some embodiments, the alkanolamine can be a secondary and/or tertiary amine. In one or more embodiments, such an alkanolamine is selected from the group consisting of dimethylethanolamine, diethylethanolamine, triethanolamine, dimethylisopropanolamine, tiisopropanolamine, diisopropylethanolamine, methyldiethanolamine, ethyldiethanolamine, isopropanoldiethanolamine, isopropyldiethanolamine, butyldiethanolamine, cyclohexyldiethanolamine, aminopropyl diethanolamine, aminopropyl diisopropanolamine, diethanolamine, diisopropanolamine, methylethanolamine, di-sec-butanolamine, butylethanolamine, N-acetylethanolamine, and mixtures thereof. In one or more embodiments, the TEOS removal rate inhibitor is a cationic polymer and can be selected from the group consisting of polyethyleneimines, polypropyleneimines, chitosans, poly(diallyldimethylammonium salt)s, poly(ester amine)s, poly(amidoamine)s, polylysines, poly(allylamine)s, poly(amino-co-ester)s, polyornithines, poly(2-ethyl-2-oxazoline)s, polyquaterniums, cationic polymers that include at least one hindered amine containing group, and mixtures thereof. In one or more embodiments, the hindered amine containing group is 2,2,6,6-tetramethylpiperidinyl. In one or more embodiments, the cationic polymer has a number average molecular weight ranging from at least about 500 g/mol (e.g., at least about 1,000 g/mol, at least about 1,500 g/mol, at least about 2,000 g/mol, at least about 2,500 g/mol, at least about 3,000 g/mol, at least about 4,000 g/mol, or at least about 5,000 g/mol) to at most about 50,000 g/mol (e.g., at most about 45,000 g/mol, at most about 40,000 g/mol, at most about 35,000 g/mol, at most about 30,000 g/mol, at most about 25,000 g/mol, at most about 20,000 g/mol, at most about 15,000 g/mol, or at most about 10,000 g/mol). Without wishing to be bound by theory, it is surprising that an amine containing compound (such as those described above) can be used as an effective TEOS removal rate inhibitor in the polishing composition described herein to reduce the removal rate of a TEOS film in a semiconductor substrate.

In one or more embodiments, the TEOS removal rate inhibitor is in an amount of from at least about 0.001% (e.g., at least about 0.005%, at least about 0.01%, at least about 0.05%, at least about 0.1%, at least about 0.5%, at least about 1%, at least about 2%, or at least about 5%) by weight to at most about 15% (e.g., at most about 14%, at most about 12%, at most about 10%, at most about 8%, at most about 6%, at most about 5%, at most about 4%, at most about 2%, at most about 1%, or at most about 0.5%) by weight of the polishing composition described herein.

In one or more embodiments, the polishing composition described herein can include at least one (e.g., two or three) cobalt removal rate enhancer. In some embodiments, the at least one cobalt removal rate enhancer is an organic acid (such as a carboxylic acid or an amino acid) or a salt thereof. In some embodiments, the cobalt removal rate enhancer can be an organic acid (e.g., an amino acid) or a salt thereof selected from the group consisting of gluconic acid, lactic acid, citric acid, tartaric acid, malic acid, glycolic acid, malonic acid, formic acid, oxalic acid, acetic acid, propionic acid, succinic acid, amino acetic acid, phenoxyacetic acid, bicine, diglycolic acid, glyceric acid, tricine, alanine, glycine, serine, methionine, leucine, histidine, valine, phenylalanine, proline, glutamine, aspartic acid, glutamic acid, arginine, lysine, tyrosine, benzoic acid, and salts and mixtures thereof. Without wishing to be bound by theory, it is surprising that an organic acid or a salt thereof (such as those described above) can be used as an effective cobalt removal rate enhancer in the polishing composition described herein to improve the removal rate of a cobalt film in a semiconductor substrate.

In one or more embodiments, the cobalt removal rate enhancer is in an amount from at least about 0.01% (e.g., at least about 0.05%, at least about 0.1%, at least about 0.2%, at least about 0.4%, at least about 0.5%, at least about 0.6%, at least about 0.8%, at least about 1%, at least about 1.5%, or at least about 2%) by weight to at most about 5% (e.g., at most about 4.5%, at most about 4%, at most about 3.5%, at most about 3%, at most about 2.5%, at most about 2%, at most about 1.5%, at most about 1%, or at most about 0.5%) by weight of the polishing composition described herein.

In one or more embodiments, the polishing composition described herein can include at least one (e.g., two or three) azole-containing corrosion inhibitor. In some embodiments, the at least one azole-containing corrosion inhibitor is selected from the group consisting of tetrazole, benzotriazole, tolyltriazole, 5-methylbenzotriazole, ethyl benzotriazole, propyl benzotriazole, butyl benzotriazole, pentyl benzotriazole, hexyl benzotriazole, dimethyl benzotriazole, chloro benzotriazole, dichloro benzotriazole, chloromethyl benzotriazole, chloroethyl benzotriazole, phenyl benzotriazole, benzyl benzotriazole, aminotriazole, aminobenzimidazole, pyrazole, imidazole, aminotetrazole, adenine, benzimidazole, thiabendazole, 1,2,3-triazole, 1,2,4-triazole, 1-hydroxybenzotriazole, 2-methylbenzothiazole, 2-aminobenzimidazole, 2-amino-5-ethyl-1,3,4-thiadazole, 3,5-diamino-1,2,4-triazole, 3-amino-5-methylpyrazole, 4-Amino-4H-1,2,4-triazole, and combinations thereof. Without wishing to be bound by theory, it is surprising that an azole-containing corrosion inhibitor (such as those described above) can significantly reduce or minimize the removal rate of copper in a semiconductor substrate.

In one or more embodiments, the azole-containing corrosion inhibitor is in an amount of from at least about 0.001% (e.g., at least about 0.002%, at least about 0.005%, at least about 0.01%, at least about 0.02%, at least about 0.05%, at least about 0.1%, at least about 0.2%, at least about 0.5%, at least about 1%, or at least about 2%) by weight to at most about 3% (e.g., at most about 2.8%, at most about 2.5%, at most about 2%, at most about 1.5%, at most about 1%, at most about 0.8%, at most about 0.5%, at most about 0.1%, at most about 0.05%, at most about 0.01%, or at most about 0.005%) by weight of the polishing composition described herein.

In one or more embodiments, the polishing composition described herein can include at least one (e.g., two or three) cobalt corrosion inhibitor. In some embodiments, the at least one cobalt corrosion inhibitor is an anionic surfactant. In one or more embodiments, the anionic surfactant comprises one or more phosphate groups and one or more of the following groups: a six to twenty four (24) carbon alkyl chain, from zero to eighteen (18) ethylene oxide groups, or a combination thereof. In one or more embodiments, the alkyl chain can have at least eight carbons, at least ten carbons, at least twelve carbons, or at least fourteen carbons. In one or more embodiments, the alkyl chain can have at most 22 carbons, or at most 20 carbons, or at most 18 carbons. In one or more embodiments, the anionic surfactant can have from at least 1 (e.g., at least 2, at least 4, at least 6, at least 8, or at least 10) to at most 18 (e.g., at most 17, at most 16, at most 15, at most 14, at most 13, at most 12, at most 11, or at most 10) ethylene oxide groups. Without wishing to be bound by theory, it is surprising that an anionic surfactant (such as those described above) can be used as a cobalt corrosion inhibitor in the polishing composition described herein to reduce or minimize the removal rate of cobalt in a semiconductor substrate. Further, without wishing to be bound by theory, it is believed that the cobalt corrosion inhibitor in the polishing composition described herein, together with other components, can adjust the dielectric/cobalt polishing selectivity of the polishing composition to about 1:1.

In one or more embodiments, the cobalt corrosion inhibitor is in an amount of from at least about 0.001% (e.g., at least about 0.002%, at least about 0.005%, at least about 0.01%, at least about 0.02%, at least about 0.05%, at least about 0.1%, at least about 0.2%, at least about 0.5%, or at least about 0.8%) by weight to at most about 1% (e.g., at most about 0.8%, at most about 0.6%, at most about 0.5%, at most about 0.4%, at most about 0.2%, at most about 0.1%, at most about 0.08%, at most about 0.05%, at most about 0.02%, at most about 0.01%, or at most about 0.005%) by weight of the polishing composition described herein.

An optional oxidizer can be added when diluting a concentrated slurry to form a POU slurry. The oxidizer can be selected from the group consisting of hydrogen peroxide, ammonium persulfate, silver nitrate ($AgNO_3$), ferric nitrates or chlorides, per acids or salts, ozone water, potassium ferricyanide, potassium dichromate, potassium iodate, potassium bromate, potassium periodate, periodic acid, vanadium trioxide, hypochlorous acid, sodium hypochlorite, potassium hypochlorite, calcium hypochlorite, magnesium hypochlorite, ferric nitrate, potassium permanganate, other inorganic or organic peroxides, and mixtures thereof. In one embodiment, the oxidizer is hydrogen peroxide.

In one or more embodiments, the oxidizer is in an amount of from at least about 0.05% (e.g., at least about 0.1%, at least about 0.2%, at least about 0.4%, at least about 0.5%, at least about 1%, at least about 1.5%, at least about 2%, at least about 2.5%, at least about 3%, at least about 3.5%, at least about 4%, or at least about 4.5%) by weight to at most about 5% (e.g., at most about 4.5%, at most about 4%, at most about 3.5%, at most about 3%, at most about 2.5%, at most about 2%, at most about 1.5%, at most about 1%, at most about 0.5%, or at most about 0.1%) by weight of the polishing composition described herein. In some embodiments, without wishing to be bound by theory, it is believed that the oxidizer can help remove metal films by forming a metal complex with the chelating agent so that the metal can be removed during the CMP process. In some embodiments, without wishing to be bound by theory, it is believed that the metal complex formed between a metal film and an oxidizer can form a passivation layer, which can protect the metal from corrosion. In some embodiments, the oxidizer may reduce the shelf life of a polishing composition. In such embodiments, the oxidizer can be added to the polishing composition at the point of use right before polishing.

In one or more embodiments, the polishing composition described herein can include a solvent (e.g., a primary solvent), such as water. In some embodiments, the solvent (e.g., water) is in an amount of from at least about 20% (e.g., at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, at least about 92%, at least about 94%, at least about 95%, or at least about 97%) by weight to at most about 99% (e.g., at most about 98%, at most about 96%, at most about 94%, at most about 92%, at most about 90%, at most about 85%, at most about 80%, at most about 75%, at most about 70%, or at most about 65%) by weight of the polishing composition described herein.

In one or more embodiments, an optional secondary solvent (e.g., an organic solvent) can be used in the polishing composition (e.g., the POU or concentrated polishing composition) of the present disclosure, which can help with the dissolution of the azole-containing corrosion inhibitor. In one or more embodiments, the secondary solvent can be one or more alcohols, alkylene glycols, or alkylene glycol ethers. In one or more embodiments, the secondary solvent comprises one or more solvents selected from the group consisting of ethanol, 1-propanol, 2-propanol, n-butanol, propylene glycol, 2-methoxyethanol, 2-ethoxyethanol, propylene glycol propyl ether, and ethylene glycol.

In one or more embodiments, the secondary solvent is in an amount of from at least about 0.005% (e.g., at least about 0.01%, at least about 0.02%, at least about 0.05%, at least about 0.1%, at least about 0.2%, at least about 0.4%, at least about 0.6%, at least about 0.8%, at least about 1%, at least about 3%, at least about 5%, or at least about 10%) by weight to at most about 15% (e.g., at most about 12%, at most about 10%, at most about 5%, at most about 3%, at most about 2%, at most about 1%, at most about 0.8%, at most about 0.6%, at most about 0.5%, or at most about 0.1%) by weight of the polishing composition described herein.

In one or more embodiments, the polishing composition described herein can be substantially free of one or more of certain ingredients, such as organic solvents, pH adjusting agents, quaternary ammonium compounds (e.g., salts or hydroxides), amines, alkali bases (such as alkali hydroxides), fluoride containing compounds, silanes (e.g., alkoxysilanes), imines (e.g., amidines such as 1,8-diazabicyclo[5.4.0]-7-undecene (DBU) and 1,5-diazabicyclo[4.3.0]non-5-ene (DBN)), salts (e.g., halide salts or metal salts), polymers (e.g., cationic or anionic polymers), surfactants (e.g., cationic surfactants, anionic surfactants, or non-ionic surfactants), plasticizers, oxidizing agents (e.g., $H_2O_2$), corrosion inhibitors (e.g., azole or non-azole corrosion inhibitors), and/or certain abrasives (e.g., ceria abrasives, non-ionic abrasives, surface modified abrasives, or negatively/positively charged abrasive). The halide salts that can be excluded from the polishing compositions include alkali metal halides (e.g., sodium halides or potassium halides) or ammonium halides (e.g., ammonium chloride), and can be chlorides, bromides, or iodides. As used herein, an ingredient that is "substantially free" from a polishing composition refers to an ingredient that is not intentionally added into the polishing composition. In some embodiments, the polishing composition described herein can have at most about 1000 ppm (e.g., at most about 500 ppm, at most about 250 ppm, at most about 100 ppm, at most about 50 ppm, at most about 10 ppm, or at most about 1 ppm) of one or more of the above ingredients that are substantially free from the polishing composition. In some embodiments, the polishing composition described herein can be completely free of one or more of the above ingredients.

In one or more embodiments, the polishing composition described herein can have a ratio of a removal rate for silicon oxides (e.g., TEOS), silicon nitrides (e.g., SiN), barrier materials (e.g., Ta, TaN) to a removal rate for Cu, Co, or a low-k dielectric material (i.e., a removal rate selectivity) ranging from at least about 1:10 (e.g., at least about 1:8, at least about 1:6, at least about 1:5, at least about 1:4, at least about 1:2, at least about 1:1.5, at least about 1:1.2, at least about 1:1.1, or at least about 1:1) to at most about 10:1 (e.g., at most about 8:1, at most about 6:1, at most about 5:1, at most about 4:1, at most about 2:1, at most about 1.5:1, at most about 1.2:1, at most about 1.1:1, or at most about 1:1). In one or more embodiments, the ratios described above can be applicable when measuring removal rates for polishing either blanket wafers or patterned wafers (e.g., wafers including conductive layers, barrier layers, and/or dielectric layers).

The present disclosure also contemplates a method of using any of the above-described polishing compositions (e.g., concentrates or POU slurries). With the concentrate, the method can comprise the steps of diluting the concentrate to form the POU slurry (e.g., by a factor of at least two), and then contacting a surface at least partially comprising cobalt with the POU slurry. In some embodiment, an oxidizer can be added to the slurry before or after the dilution. With the POU slurry, the method comprises the step of contacting the surface at least partially comprising cobalt with the slurry.

In one or more embodiments, this disclosure features a polishing method that can include applying a polishing composition according to the present disclosure to a substrate (e.g., a wafer) having at least cobalt on a surface of the substrate; and bringing a pad into contact with the surface of the substrate and moving the pad in relation to the substrate. In some embodiments, when the substrate includes at least one or more of silicon oxides (e.g., TEOS), silicon nitrides (e.g., SiN), and/or barrier materials (e.g., Ta, TaN, Ti, or TiN), the above method can remove at least a portion of these materials at about the same rate as it removes cobalt. For example, in one or more embodiments, polishing compositions of the present disclosure have a difference in polishing rates between TEOS/SiN and Co of less than about 20%, less than about 15%, less than about 10%, or less than about 5%. It is to be noted that the term "silicon oxide" described herein is expressly intended to include both un-doped and doped versions of silicon oxide. For example, in one or more embodiments, the silicon oxide can be doped with at least one dopant selected from carbon, nitrogen, oxygen, hydrogen, or any other known dopants for silicon oxide. Some examples of silicon oxide film types include TEOS (tetra-ethyl orthosilicate), SiOC, SiOCN, SiOCH, SiOH and SiON.

In some embodiments, the method that uses a polishing composition described herein can further include producing a semiconductor device from the substrate treated by the polishing composition through one or more steps. For example, photolithography, ion implantation, dry/wet etching, plasma ashing, deposition (e.g., PVD, CVD, ALD, ECD), wafer mounting, die cutting, packaging, and testing can be used to produce a semiconductor device from the substrate treated by the polishing composition described herein.

The specific examples below are to be construed as merely illustrative, and not limitative of the remainder of the disclosure in any way whatsoever. Without further elaboration, it is believed that one skilled in the art can, based on the description herein, utilize the present invention to its fullest extent.

EXAMPLES

In these examples, the polishing was performed on 300 mm wafers, using an AMAT Reflexion LK CMP polisher, a Fujibo H804 pad, a downforce pressure of 1.5 psi, a platen head velocity of 101/95 rpm, and a slurry flow rate of 300 mL/min.

The general compositions used in the examples below are shown in Table 1 below. The specifics details on the differences in the compositions tested will be explained in further detail when discussing the respective examples.

TABLE 1

| Component | % By Weight of Composition |
| --- | --- |
| pH adjuster (base) | 0-3 |
| Barrier Film Removal Rate Enhancer (Organic Acid) | 0.01-1 |
| TEOS Removal Rate Inhibitor | 0.1-10 (if used) |
| Azole-Containing Corrosion Inhibitor | 0.001-0.5 |
| Cobalt Corrosion Inhibitor (anionic surfactant) | 0.001-0.2 |
| Cobalt Removal Rate Enhancer (amino acid) | 0.01-2 |
| Organic Solvent | 0.005-3 |
| Abrasive (silica) | 0.1-12 |
| Oxidizer | 0.1-5 (if used) |
| Solvent (DI Water) | 75-99 |
| pH | 7-12 |

Example 1

Table 2 below shows the removal rate for TEOS, SiN, and Co blanket wafers when polished using Compositions 1-5. Compositions 1-5 contained the same ingredients at the same concentrations except for the differences identified below and in Table 2. Composition 1 was a control that did not include any TEOS removal rate inhibitor (TEOS RRI). Compositions 2-5 included an alkanolamine as the TEOS RRI-1 at several different concentrations.

The results showed that the alkanolamine can reduce the TEOS removal rate with no significant effect (or only a slight effect) on the SiN and Co removal rates, which demonstrates that the alkanolamine can be used as a TEOS removal rate inhibitor. Further, the TEOS removal rate shows a gradual decrease as the concentration of the alkanolamine increases.

TABLE 2

|  | TEOS RR (Å/min) | SiN RR (Å/min) | Co RR (Å/min) |
|---|---|---|---|
| Comp. 1 - Control | 193 | 90 | 72 |
| Comp. 2 - 1X TEOS RRI-1 | 160 | 81 | 43 |
| Comp. 3 - 2X TEOS RRI-1 | 128 | 76 | 97 |
| Comp. 4 - 3X TEOS RRI-1 | 130 | 72 | 79 |
| Comp. 5 - 4X TEOS RRI-1 | 101 | 69 | 74 |

RR = removal rate

Example 2

Table 3 below shows the removal rates for TEOS, SiN, and Co blanket wafers when polished using Compositions 6-11. Compositions 6-11 contained the same ingredients at the same concentrations except for the differences identified below and in Table 3. Compositions 6-11 included no TEOS RRI. The aspect of the compositions that varied in this example was the size of the colloidal silica abrasive used in the polishing composition. Abrasives 1-6 were colloidal silica abrasives having an average diameter of 40 nm, 40 nm, 25 nm, 25 nm, 25 nm, and 18 nm, respectively. Abrasive 1 and Abrasive 2 were different only in the fact that Abrasive 2 had a lower density of silanol groups on the surface. Abrasive 3 and Abrasive 4 were different only in the fact that Abrasive 3 had a lower density of silanol groups on the surface. Abrasive 5 and Abrasive 6 were colloidal silica that had been chemically modified to be negatively charged across all pH ranges.

The results in Table 3 show that the abrasive size can have an impact on the polishing selectivity between TEOS:SiN. Specifically, a roughly 1:1 selectivity for TEOS:SiN can be achieved with the use of smaller sized abrasives (i.e., less than 30 nm particle size). In contrast, the larger sized abrasives used in Compositions 6 and 7 resulted in compositions that polished TEOS more rapidly than SiN.

TABLE 3

|  | TEOS RR (Å/min) | SiN RR (Å/min) | Co RR (Å/min) |
|---|---|---|---|
| Comp. 6 - 40 nm - Abrasive 1 | 93 | 72 | 19 |
| Comp. 7 - 40 nm - Abrasive 2 | 91 | 72 | 35 |
| Comp. 8 - 25 nm - Abrasive 3 | 53 | 56 | 23 |
| Comp. 9 - 25 nm - Abrasive 4 | 47 | 41 | 7 |
| Comp. 10 - 25 nm - Abrasive 5 | 42 | 41 | 21 |
| Comp. 11 - 18 nm - Abrasive 6 | 8 | 12 | 35 |

Example 3

Table 4 below shows the removal rates for TEOS, SiN, and Co blanket wafers when polished using Compositions 12-14. Compositions 12-14 contained the same ingredients at the same concentrations except for the differences identified below and in Table 4. In particular, Compositions 12-14 contained a phosphate based anionic surfactant as a cobalt corrosion inhibitor (Co CI-1) at different concentrations.

The results in Table 4 show that the phosphate based anionic surfactant has a demonstrable effect on the Co polishing rate and the concentration can be varied to achieve a roughly 1:1:1 selectivity for TEOS:SiN:Co.

TABLE 4

|  | TEOS RR (Å/min) | SiN RR (Å/min) | Co RR (Å/min) |
|---|---|---|---|
| Comp. 12 - 25 nm - Abrasive 1 and 25X Co CI-1 | 55 | 61 | 18 |
| Comp. 13 - 25 nm - Abrasive 1 and 15X Co CI-1 | 58 | 57 | 30 |
| Comp. 14 - 25 nm - Abrasive 1 and 10X Co CI-1 | 62 | 65 | 53 |

Example 4

Table 5 below shows the removal rates for TEOS, SiN, and Co blanket wafers when polished using Compositions 15-19. Compositions 15-19 contained the same ingredients at the same concentrations except for the differences identified below and in Table 5. Composition 15 was a control that did not include any TEOS removal rate inhibitor. Compositions 16-19 included a cationic polymer that includes at least one hindered amine group as a TEOS removal rate inhibitor (TEOS RRI-2). In addition, Compositions 15-19 all contained a phosphate based anionic surfactant as a cobalt corrosion inhibitor (Co CI-1) at different concentrations.

As shown in Table 5, the results obtained from Compositions 15 and 16 show that the inclusion of the above cationic polymer can effectively minimize the difference in removal rate between TEOS and SiN leading to a roughly 1:1 ratio for the removal rate of TEOS:SiN. Further, the Co CI-1 concentration can be used to tune the cobalt removal rate.

TABLE 5

|  | TEOS RR (Å/min) | SiN RR (Å/min) | Co RR (Å/min) |
|---|---|---|---|
| Comp. 15 - Control - 25X Co CI-1 | 108 | 82 | 26 |
| Comp. 16 - 25X Co CI-1 and 1X TEOS RRI-2 | 86 | 81 | 30 |
| Comp. 17 - 15X Co CI-1 and 1X TEOS RRI-2 | 84 | 78 | 31 |
| Comp. 18 - 10X Co CI-1 and 1X TEOS RRI-2 | 91 | 95 | 53 |
| Comp. 19 - 5X Co CI-1 and 1X TEOS RRI-2 | 77 | 84 | 54 |

Example 5

Table 6 below shows the removal rates for TEOS, SiN, and Co blanket wafers when polished using Compositions 20-22. Compositions 20-22 contained the same ingredients at the same concentrations except for the differences identified below and in Table 6. In particular, Composition 20 included an alkanolamine that was a primary amine as TEOS RRI-3, Composition 21 included an alkanolamine that was a secondary amine as TEOS RRI-4, and Composition 22 included an alkanolamine that was a tertiary amine as TEOS RRI-5.

As shown in Table 6, the polishing compositions including a TEOS RRI that is a secondary or tertiary amine (i.e., Compositions 21 and 22) surprisingly inhibited the TEOS removal rate to a greater degree than the polishing composition including TEOS RRI that is a primary amine (i.e., Composition 20). Further, Compositions 21 and 22 substantially negated the removal rate difference between TEOS and SiN.

TABLE 6

|  | TEOS RR (Å/min) | SiN RR (Å/min) | Co RR (Å/min) |
|---|---|---|---|
| Comp. 20 - TEOS RRI-3 | 109 | 79 | 48 |
| Comp. 21 - TEOS RRI-4 | 62 | 62 | 71 |
| Comp. 22 - TEOS RRI-5 | 42 | 42 | 76 |

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A polishing composition, comprising:
an abrasive;
optionally, a pH adjuster;
a barrier film removal rate enhancer;
a TEOS removal rate inhibitor in an amount of from about 0.001% to about 15% by weight of the composition;
a cobalt removal rate enhancer;
an azole-containing corrosion inhibitor; and
a cobalt corrosion inhibitor in an amount of from about 0.001% to about 1% by weight of the composition, the cobalt corrosion inhibitor being an anionic surfactant comprising one or more phosphate groups and a combination of a six to twenty four carbon alkyl chain and one to eighteen ethylene oxide groups;
wherein the barrier film removal rate enhancer is different from the cobalt removal rate enhancer and the composition is free of a surface modified abrasive and an oxidizing agent.

2. The polishing composition of claim 1, wherein the abrasive is selected from the group consisting of alumina, silica, titania, ceria, zirconia, co-formed products of alumina, silica, titania, ceria, or zirconia, coated abrasives, and mixtures thereof.

3. The polishing composition of claim 1, wherein the abrasive is in an amount of from about 0.1% to about 25% by weight of the composition.

4. The polishing composition of claim 1, wherein the composition comprises the pH adjuster and the pH adjuster is selected from the group consisting of ammonium hydroxide, sodium hydroxide, potassium hydroxide, cesium hydroxide, monoethanolamine, diethanolamine, triethanolamine, methyl ethanolamine, methyldiethanolamine tetrabutylammonium hydroxide, tetrapropylammonium hydroxide, tetraethylammonium hydroxide, tetramethylammonium hydroxide, ethyltrimethylammonium hydroxide, diethyldimethylammonium hydroxide, dimethyldipropylammonium hydroxide, benzyltrimethylammonium hydroxide, tris(2-hydroxyethyl)methylammonium hydroxide, choline hydroxide, and any combinations thereof.

5. The polishing composition of claim 1, wherein the pH adjuster in an amount of from about 0.01% to about 10% by weight of the composition.

6. The polishing composition of claim 1, wherein the barrier film removal rate enhancer is an organic acid or a salt thereof selected from the group consisting of gluconic acid, lactic acid, citric acid, tartaric acid, malic acid, glycolic acid, malonic acid, formic acid, oxalic acid, acetic acid, propionic acid, succinic acid, amino acetic acid, phenoxyacetic acid, bicine, phosphoric acid, diglycolic acid, glyceric acid, tricine, benzoic acid, nitrilotriacetic acid, ethylenediaminetetraacetic acid, pentetic acid, diaminocyclohexanetetraacetic acid, ethyl phosphoric acid, cyanoethyl phosphoric acid, phenyl phosphoric acid, vinyl phosphoric acid, poly(vinylphosphonic acid), 1-hydroxyethane-1,1-diphosphonic acid, nitrilotri(methylphosphonic acid), diethyl enetriaminepentakis (methylphosphonic acid), N,N,N'N'-ethylenediaminetetrakis(methylene phosphonic acid), n-hexylphosphonic acid, benzylphosphonic acid, phenylphosphonic acid, and salts and mixtures thereof.

7. The polishing composition of claim 1, wherein the barrier film removal rate enhancer is in an amount of from about 0.01% to about 3% by weight of the composition.

8. The polishing composition of claim 1, wherein the TEOS removal rate inhibitor is an amine containing compound selected from the group consisting of alkanolamines and cationic polymers.

9. The polishing composition of claim 8, wherein the alkanolamine is a secondary or tertiary amine.

10. The polishing composition of claim 9, wherein the alkanolamine is selected from the group consisting of dimethylethanolamine, diethylethanolamine, triethanolamine, dimethylisopropanolamine, tiisopropanolamine, diisopropylethanolamine, methyldiethanolamine, ethyldiethanolamine, isopropanoldiethanolamine, isopropyldiethanolamine, butyldiethanolamine, cyclohexyldiethanolamine, aminopropyl diethanolamine, aminopropyl diisopropanolamine, diethanolamine, diisopropanolamine, methylethanolamine, di-sec-butanolamine, butylethanolamine, N-acetylethanolamine, and mixtures thereof.

11. The polishing composition of claim 8, wherein the TEOS removal rate inhibitor is a cationic polymer.

12. The polishing composition of claim 11, wherein the cationic polymer is selected from the group consisting of polyethyleneimines, polypropyleneimines, chitosans, poly(diallyldimethylammonium salt)s, poly(ester amine)s, poly(amidoamine)s, polylysines, poly(allylamine)s, poly(aminoco-ester)s, polyornithines, poly(2-ethyl-2-oxazoline)s, polyquaterniums, cationic polymers that include at least one hindered amine containing group, and mixtures thereof.

13. The polishing composition of claim 12, wherein the hindered amine containing group is 2,2,6,6-tetramethylpiperidinyl.

14. The polishing composition of claim 11, wherein the cationic polymer has a number average molecular weight between about 500 g/mol and about 50,000 g/mol.

15. The polishing composition of claim 1, wherein the TEOS removal rate inhibitor in an amount of from about 0.005% to about 15% by weight of the composition.

16. The polishing composition of claim 1, wherein the cobalt removal rate enhancer is an organic acid or a salt thereof selected from the group consisting of gluconic acid, lactic acid, citric acid, tartaric acid, malic acid, glycolic acid, malonic acid, formic acid, oxalic acid, acetic acid, propionic acid, succinic acid, amino acetic acid, phenoxyacetic acid, bicine, diglycolic acid, glyceric acid, tricine, alanine, glycine, serine, methionine, leucine, histidine, valine, phenylalanine, proline, glutamine, aspartic acid, glutamic acid, arginine, lysine, tyrosine, benzoic acid, and salts and mixtures thereof.

17. The polishing composition of claim 1, wherein the cobalt removal rate enhancer is in an amount of from about 0.01% to about 5% by weight of the composition.

18. The polishing composition of claim 1, wherein the azole-containing corrosion inhibitor is selected from the group consisting of tetrazole, benzotriazole, tolyltriazole, 5-methylbenzotriazole, ethyl benzotriazole, propyl benzotriazole, butyl benzotriazole, pentyl benzotriazole, hexyl benzotriazole, dimethyl benzotriazole, chloro benzotriazole, dichloro benzotriazole, chloromethyl benzotriazole, chloroethyl benzotriazole, phenyl benzotriazole, benzyl benzotriazole, aminotriazole, aminobenzimidazole, pyrazole, imidazole, aminotetrazole, adenine, benzimidazole, thiabendazole, 1,2,3-triazole, 1,2,4-triazole, 1-hydroxybenzotriazole, 2-methylbenzothiazole, 2-aminobenzimidazole, 2-amino-5-ethyl-1,3,4-thiadazole, 3,5-diamino-1,2,4-triazole, 3-amino-5-methylpyrazole, 4-amino-4H-1,2,4-triazole, and combinations thereof.

19. The polishing composition of claim 1, wherein the azole-containing corrosion inhibitor in an amount of from about 0.001% to about 3% by weight of the composition.

20. The polishing composition of claim 1, wherein the cobalt corrosion inhibitor in an amount of from about 0.001% to about 0.8% by weight of the composition.

21. The polishing composition of claim 1, wherein the composition comprises:
the abrasive in an amount of from about 0.1% to about 25% by weight of the composition;
the pH adjuster in an amount of from about 0.01% to about 10% by weight of the composition;
the barrier film removal rate enhancer in an amount of from about 0.01% to about 3% by weight of the composition;
the TEOS removal rate inhibitor in an amount of from about 0.005% to about 15% by weight of the composition;
the cobalt removal rate enhancer is in an amount of from about 0.01% to about 5% by weight of the composition;
the azole-containing corrosion inhibitor in an amount of from about 0.001% to about 3% by weight of the composition; and
the cobalt corrosion inhibitor in an amount of from about 0.001% to about 0.8% by weight of the composition.

22. The polishing composition of claim 1, wherein the pH of the composition is between about 7 and about 14.

23. The polishing composition of claim 1, wherein the anionic surfactant comprises one to ten ethylene oxide groups.

24. A polishing composition, comprising:
an abrasive;
optionally, a pH adjuster;
an organic acid or a salt thereof;
an amino acid;
an alkanolamine or a cationic polymer, wherein the alkanolamine is a secondary or tertiary amine and the cationic polymer is selected from the group consisting of polyethyleneimines, polypropyleneimines, chitosans, poly(diallyldimethylammonium salt)s, poly(ester amine)s, poly(amidoamine)s, polylysines, poly(allylamine)s, poly(amino-co-ester)s, polyornithines, polyquaterniums, cationic polymers that include at least one hindered amine containing group, and mixtures thereof;
an azole-containing corrosion inhibitor; and
an anionic surfactant comprising one or more phosphate groups and a combination of a six to twenty four carbon alkyl chain and one to eighteen ethylene oxide groups;
wherein the organic acid is different from the amino acid and the composition is free of a surface modified abrasive, an oxidizing agent, and a non-ionic surfactant.

25. The polishing composition of claim 24, wherein the abrasive is selected from the group consisting of alumina, silica, titania, ceria, zirconia, co-formed products of alumina, silica, titania, ceria, or zirconia, coated abrasives, and mixtures thereof.

26. The polishing composition of claim 24, wherein the abrasive is in an amount of from about 0.1% to about 25% by weight of the composition.

27. The polishing composition of claim 25, wherein the composition comprises the pH adjuster and the pH adjuster is selected from the group consisting of ammonium hydroxide, sodium hydroxide, potassium hydroxide, cesium hydroxide, monoethanolamine, diethanolamine, triethanolamine, methyl ethanolamine, methyldiethanolamine tetrabutylammonium hydroxide, tetrapropylammonium hydroxide, tetraethylammonium hydroxide, tetramethylammonium hydroxide, ethyltrimethylammonium hydroxide, diethyldimethylammonium hydroxide, dimethyldipropylammonium hydroxide, benzyltrimethylammonium hydroxide, tris(2-hydroxyethyl)methylammonium hydroxide, choline hydroxide, and any combinations thereof.

28. The polishing composition of claim 24, wherein the pH adjuster in an amount of from about 0.01% to about 10% by weight of the composition.

29. The polishing composition of claim 24, wherein the organic acid or a salt thereof is selected from the group consisting of gluconic acid, lactic acid, citric acid, tartaric acid, malic acid, glycolic acid, malonic acid, formic acid, oxalic acid, acetic acid, propionic acid, succinic acid, amino acetic acid, phenoxyacetic acid, bicine, phosphoric acid, diglycolic acid, glyceric acid, tricine, benzoic acid, nitrilotriacetic acid, ethylenediaminetetraacetic acid, pentetic acid, diaminocyclohexanetetraacetic acid, ethyl phosphoric acid, cyanoethyl phosphoric acid, phenyl phosphoric acid, vinyl phosphoric acid, poly(vinylphosphonic acid), 1-hydroxyethane-1,1-diphosphonic acid, nitrilotri(methylphosphonic acid), diethylenetriaminepentakis (methylphosphonic acid), N,N,N'N'-ethylenediaminetetrakis(methylene phosphonic acid), n-hexylphosphonic acid, benzylphosphonic acid, phenylphosphonic acid, and salts and mixtures thereof.

30. The polishing composition of claim 24, wherein the organic acid or a salt thereof is in an amount of from about 0.01% to about 3% by weight of the composition.

31. The polishing composition of claim 24, wherein the alkanolamine is a tertiary amine.

32. The polishing composition of claim 24, wherein the alkanolamine is selected from the group consisting of dimethylethanolamine, diethylethanolamine, triethanolamine, dimethylisopropanolamine, tiisopropanolamine, diisopropylethanolamine, methyldiethanolamine, ethyldiethanolamine, isopropanoldiethanolamine, isopropyldiethanolamine, butyldiethanolamine, cyclohexyldiethanolamine, aminopropyl diethanolamine, aminopropyl diisopropanolamine, diethanolamine, diisopropanolamine, methyl ethanolamine, di-sec-butanolamine, butylethanolamine, N-acetylethanolamine, and mixtures thereof.

33. The polishing composition of claim 24, wherein the cationic polymer is selected from the group consisting of polyethyleneimines, chitosans, poly(diallyldimethylammonium salt)s, poly(ester amine)s, poly(amidoamine)s, polylysines, poly(allylamine)s, poly(amino-co-ester)s, polyornithines, poly(2-ethyl-2-oxazoline)s, polyquaterniums, cationic polymers that include at least one hindered amine containing group, and mixtures thereof.

34. The polishing composition of claim 33, wherein the hindered amine containing group is 2,2,6,6-tetramethylpiperidinyl.

35. The polishing composition of claim 24, wherein the cationic polymer has a number average molecular weight between about 500 g/mol and about 50,000 g/mol.

36. The polishing composition of claim 24, wherein the alkanolamine or cationic polymer is in an amount of from about 0.001% to about 15% by weight of the composition.

37. The polishing composition of claim 24, wherein the amino acid is selected from the group consisting of amino acetic acid, bicine, tricine, alanine, glycine, serine, methionine, leucine, histidine, valine, phenylalanine, proline, glutamine, aspartic acid, glutamic acid, arginine, lysine, tyrosine, and mixtures thereof.

38. The polishing composition of claim 24, wherein the amino acid is in an amount of from about 0.01% to about 5% by weight of the composition.

39. The polishing composition of claim 24, wherein the azole-containing corrosion inhibitor is selected from the group consisting of tetrazole, benzotriazole, tolyltriazole, 5-methylbenzotriazole, ethyl benzotriazole, propyl benzotriazole, butyl benzotriazole, pentyl benzotriazole, hexyl benzotriazole, dimethyl benzotriazole, chloro benzotriazole, dichloro benzotriazole, chloromethyl benzotriazole, chloroethyl benzotriazole, phenyl benzotriazole, benzyl benzotriazole, aminotriazole, aminobenzimidazole, pyrazole, imidazole, aminotetrazole, adenine, benzimidazole, thiabendazole, 1,2,3-triazole, 1,2,4-triazole, 1-hydroxybenzotriazole, 2-methylbenzothiazole, 2-aminobenzimidazole, 2-amino-5-ethyl-1,3,4-thiadazole, 3,5-diamino-1,2,4-triazole, 3-amino-5-methylpyrazole, 4-amino-4H-1,2,4-triazole, and combinations thereof.

40. The polishing composition of claim 24, wherein the azole-containing corrosion inhibitor in an amount of from about 0.001% to about 3% by weight of the composition.

41. The polishing composition of claim 24, wherein the anionic surfactant is in an amount of from about 0.001% to about 1% by weight of the composition.

42. The polishing composition of claim 24, wherein the composition comprises:
the abrasive in an amount of from about 0.1% to about 25% by weight of the composition;
the pH adjuster in an amount of from about 0.01% to about 10% by weight of the composition;
the organic acid or a salt thereof in an amount of from about 0.01% to about 3% by weight of the composition;
the alkanolamine or cationic polymer is in an amount of from about 0.001% to about 15% by weight of the composition;
the amino acid is in an amount of from about 0.01% to about 5% by weight of the composition;
the azole-containing corrosion inhibitor in an amount of from about 0.001% to about 3% by weight of the composition; and
the anionic surfactant in an amount of from about 0.001% to about 1% by weight of the composition.

43. The polishing composition of claim 24, wherein the pH of the composition is between about 7 and about 14.

44. The polishing composition of claim 24, wherein the anionic surfactant comprises one to ten ethylene oxide groups.

45. A method of polishing a substrate, comprising the steps of:
applying the polishing composition of claim 1 to a surface of a substrate, wherein the surface comprises cobalt; and
bringing a pad into contact with the surface of the substrate and moving the pad in relation to the substrate.

46. A method of polishing a substrate, comprising the steps of:
applying the polishing composition of claim 24 to a surface of a substrate, wherein the surface comprises cobalt; and
bringing a pad into contact with the surface of the substrate and moving the pad in relation to the substrate.

* * * * *

UNITED STATES PATENT AND TRADEMARK OFFICE
CERTIFICATE OF CORRECTION

PATENT NO. : 11,732,157 B2
APPLICATION NO. : 17/063965
DATED : August 22, 2023
INVENTOR(S) : Yannan Liang et al.

Page 1 of 1

It is certified that error appears in the above-identified patent and that said Letters Patent is hereby corrected as shown below:

On the Title Page

Column 2 item (56) (Other Publications), Line 1, delete "Componenets" and insert -- Components --

Column 2 item (56) (Other Publications), Line 2, delete "Microelectroni" and insert -- Microelectronic --

Column 2 item (56) (Other Publications), Line 9, delete "Surfacants:" and insert -- Surfactants: --

In the Claims

Column 13
Line 57, in Claim 4, delete "methyl ethanolamine," and insert -- methylethanolamine, --

Column 14
Lines 13-14, in Claim 6, delete "diethyl enetriaminepentakis (methylphosphonic" and insert -- diethylenetriaminepentakis(methylphosphonic --

Column 16
Line 13 (Approx.), in Claim 27, delete "claim 25," and insert -- claim 24, --
Line 19, in Claim 27, delete "methyl ethanolamine," and insert -- methylethanolamine, --
Line 43, in Claim 29, delete "diethylenetriaminepentakis (methylphosphonic" and insert -- diethylenetriaminepentakis(methylphosphonic --
Line 60, in Claim 32, delete "methyl ethanolamine," and insert -- methylethanolamine, --

Signed and Sealed this
Ninth Day of July, 2024

Katherine Kelly Vidal
*Director of the United States Patent and Trademark Office*